United States Patent
Chen et al.

(10) Patent No.: US 10,879,918 B1
(45) Date of Patent: Dec. 29, 2020

(54) ATOMIC BEAM OPTICAL CLOCK WITH PULSE MODULATED BROAD-SPECTRUM CLOCK LASER DETECTION, AND IMPLEMENTATION METHOD THEREOF

(71) Applicant: Wenzhou Collaborative Innovation Center of Laser and Optoelectronics, Beijing (CN)

(72) Inventors: Jingbiao Chen, Beijing (CN); Haosen Shang, Beijing (CN)

(73) Assignee: Wenzhou Collaborative Innovation Center of Laser and Optoelectronics, Beijing (CN)

( * ) Notice: Subject to any disclaimer, the term of this patent is extended or adjusted under 35 U.S.C. 154(b) by 0 days.

(21) Appl. No.: 16/720,353

(22) Filed: Dec. 19, 2019

(30) Foreign Application Priority Data

Sep. 2, 2019 (CN) .......................... 2019 1 0823353

(51) Int. Cl.
| | |
|---|---|
| *H03L 7/26* | (2006.01) |
| *G01N 21/64* | (2006.01) |
| *G04F 5/14* | (2006.01) |

(52) U.S. Cl.
CPC ........... *H03L 7/26* (2013.01); *G01N 21/6404* (2013.01); *G04F 5/14* (2013.01); *G01N 2201/06113* (2013.01)

(58) Field of Classification Search
CPC ................. H03L 7/26; G04F 5/14; H01S 1/06
See application file for complete search history.

(56) References Cited

U.S. PATENT DOCUMENTS

| 8,143,956 B2 | 3/2012 | Chen |
| 2009/0302957 A1 | 12/2009 | Levi |

FOREIGN PATENT DOCUMENTS

| CN | 1786853 A | 6/2006 |
| CN | 100478809 C | 4/2009 |
| CN | 103809426 A | 5/2014 |

(Continued)

OTHER PUBLICATIONS

McFerran, John J., and Andre N. Luiten. "Fractional frequency instability in the 10-14 range with a thermal beam optical frequency reference." JOSA B 27.2 (2010): 277-285. (Year: 2010).*

(Continued)

*Primary Examiner* — Ryan Johnson
(74) *Attorney, Agent, or Firm* — Maier & Maier, PLLC

(57) ABSTRACT

An atomic beam optical clock with pulse modulated broad-spectrum clock laser detection and an implementation method thereof. The atomic beam optical clock with pulse modulated broad-spectrum clock laser detection includes a power control system, a broad-spectrum narrow-linewidth clock laser system, an atomic beam in an atomic beam vacuum tube, a blue light detection laser system and a photoelectric detection module. By generating a comb-toothed clock laser signal and interacting with the atomic beam, almost all atoms of the lower energy level of clock transition are excited to the upper energy level of the clock transition, and then through the interaction with the detection laser emitted by the blue light detection laser system, a narrow-linewidth fluorescent signal with high signal-to-noise ratio is obtained and sent to the power control system to servo the frequency of the broad-spectrum narrow-linewidth clock laser system.

18 Claims, 2 Drawing Sheets

(56) References Cited

FOREIGN PATENT DOCUMENTS

| CN | 103885324 A | | 6/2014 |
|---|---|---|---|
| CN | 104919361 A | | 9/2015 |
| CN | 106444210 A | | 2/2017 |
| CN | 108508733 A | * | 9/2018 |
| CN | 108832926 A | | 11/2018 |
| CN | 109743115 A | | 5/2019 |
| CN | 110148879 A | | 8/2019 |

OTHER PUBLICATIONS

Chinese Office Action dated Aug. 20, 2020 in connection with corresponding CN Application No. 201910823353.4 (10 pp., including machine-generated English translation).

* cited by examiner

ATOMIC BEAM OPTICAL CLOCK WITH PULSE MODULATED BROAD-SPECTRUM CLOCK LASER DETECTION, AND IMPLEMENTATION METHOD THEREOF

CROSS-REFERENCE TO RELATED APPLICATION

This application claims priority to Chinese Patent Application No. 201910823353.4, filed on Sep. 2, 2019, which is hereby incorporated by reference in its entirety.

FIELD

Embodiments of the present disclosure relate to the technical field of optical atomic clocks and optical frequency standards, and more particularly to an atomic beam optical clock with pulse modulated broad-spectrum clock laser detection and an implementation method thereof.

BACKGROUND

Atomic beam optical clocks have the advantages of small size, transportability, low system complexity, high frequency stability, etc., and thus have a huge application prospect. They can be widely used in time keeping and time service, satellite navigation system, time synchronization, geodesy, precision spectroscopy and other fields.

In the prior art of "METHOD AND EQUIPMENT FOR ENHANCING PERFORMANCE OF MINI ATOM BEAM OPTICAL ATOMIC CLOCK" with the patent number ZL20051010130745.0, a clock laser having a linewidth narrower than the natural linewidth of the clock transition energy level is used to detect the clock transition energy level, and a clock transition related fluorescent signal is obtained by further combining an electron shelving detection method for atomic beam, thereby realizing a high-stability atomic beam optical clock. In addition, in the prior art of "ATOMIC BEAM OPTICAL FREQUENCY ATOMIC CLOCK AND A PRODUCING METHOD THEREOF" with the publication number U.S. Pat. No. 8,143,956 B2, an atomic clock at optical frequency based on atomic beam and a method for generating the atomic clock are provided.

However, during the implementation process, it is found that the flight velocity of atoms in the atomic beam reaches several hundred meters per second. In the absence of collimated diaphragm or other methods for reducing the transverse divergence angle of the atomic beam, the spectral line broadening caused by the Doppler effect can reach several hundred MHz, even up to the order of GHz. Atoms with high transverse velocity cannot be effectively excited to the upper energy level of the clock transition due to the short interaction time with the narrow-linewidth clock laser as well as the large Doppler shift. That is to say, in the prior art, only very small parts of atoms whose transverse velocity is near zero contribute to the clock transition spectroscopy signal, thus the utilization efficiency of atoms is extremely low, which limits the further improvement of the frequency stability of the atomic beam optical clock.

SUMMARY

The technical problem to be solved by the present disclosure is directed to the above-mentioned defect existing in the prior art, and to provide an atomic beam optical clock with pulse modulated broad-spectrum clock laser detection and an implementation method thereof, for solving the problem in the prior art that most of the ground state atoms do not contribute to the clock transition spectroscopy but form a large Doppler background, resulting in that the utilization efficiency of atoms is extremely low, thereby limiting the further improvement of the frequency stability of the atomic beam optical clock.

According to an aspect of embodiments of the present disclosure, an embodiment of the present disclosure provides an atomic beam optical clock with pulse modulated broad-spectrum clock laser detection, where the atomic beam optical clock with pulse modulated broad-spectrum clock laser detection includes:

a power control system, configured to generate a pulse modulation signal, and transmit the pulse modulation signal to a broad-spectrum narrow-linewidth clock laser system;

where the power control system also includes a servo feedback circuit, a modulation and demodulation circuit, etc., which will be specifically described later;

a broad-spectrum narrow-linewidth clock laser system, where a laser head of the broad-spectrum narrow-linewidth clock laser system, configured to generate a comb-toothed clock laser signal under an action of the pulse modulation signal, where a spectral interval between any two adjacent comb teeth of the comb-toothed clock laser signal is 10 kHz to 10 MHz, and an overall spectral width of the comb-toothed clock laser signal is 10 MHz to 5 GHz, where the linewidth of a single comb tooth is smaller than the natural linewidth of the clock transition energy level;

an atomic beam in an atomic beam vacuum tube (that is, a physical part of the atomic beam optical clock), configured to provide atoms excited from a lower energy level of the clock transition to an upper energy level of the clock transition under an action of the comb-toothed clock laser signal;

a blue light detection laser system, configured to emit a detection laser, such that the detection laser interacts with the atoms of the upper energy level of the clock transition or the atoms of the lower energy level of the clock transition to generate a fluorescent signal; and a photoelectric detection module, configured to collect the fluorescent signal, and send the fluorescent signal to the power control system, such that the power control system locks a frequency of the comb-toothed clock laser signal of the broad-spectrum narrow-linewidth clock laser system.

In some embodiments, the atoms include any one of calcium atoms, magnesium atoms, strontium atoms, ytterbium atoms, mercury atoms, cadmium atoms, rubidium atoms, and cesium atoms.

In some embodiments, a pulse width of the pulse modulation signal has a range from 0.2 ns to 100 ns, and an interval between any two adjacent pulses has a range from 0.1 µs to 100 µs.

In some embodiments, the spectral interval between any two adjacent comb teeth of the comb-toothed clock laser signal is 1 MHz, and an overall spectral width of a comb-toothed clock laser signal is 1 GHz.

In some embodiments, a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

According to another aspect of the embodiments of the present disclosure, an embodiment of the present disclosure further provides a method for implementing an atomic beam optical clock with pulse modulated broad-spectrum clock laser detection, where the method includes:

generating, by a power control system, a pulse modulation signal, and transmitting, by the power control system, the pulse modulation signal to a broad-spectrum narrow-linewidth clock laser system;

generating, by a laser head of the broad-spectrum narrow-linewidth clock laser system, a comb-toothed clock laser signal under an action of the pulse modulation signal, where a spectral interval between any two adjacent comb teeth of the comb-toothed clock laser signal is 10 kHz to 10 MHz, an overall spectral width of the comb-toothed clock laser signal is 10 MHz to 5 GHz, and the linewidth of a single comb tooth is smaller than the natural linewidth of the clock transition energy level;

providing, by an atomic beam of an atomic beam optical clock, atoms excited from a lower energy level of the clock transition to an upper energy level of the clock transition under an action of the comb-toothed clock laser signal;

generating a fluorescent signal through an interaction between a detection laser emitted by a blue light detection laser system and the atoms of the upper energy level of the clock transition or the atoms of the lower energy level of the clock transition; and collecting, by a photoelectric detection module, the fluorescent signal, and sending, by the photoelectric detection module, the fluorescent signal to the power control system, such that the power control system locks a frequency of the comb-toothed clock laser signal of the broad-spectrum narrow-linewidth clock laser system.

In some embodiments, the atoms include any one of calcium atoms, magnesium atoms, strontium atoms, ytterbium atoms, mercury atoms, cadmium atoms, rubidium atoms, and cesium atoms; and a pulse width of the pulse modulation signal has a range from 0.2 ns to 100 ns, and an interval between any two adjacent pulses has a range from 0.1 μs to 100 μs.

In some embodiments, the spectral interval between any two adjacent comb teeth of the comb-toothed clock laser signal is 1 MHz, and the overall spectral width of the comb-toothed clock laser signal is 1 GHz; and a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

The embodiments of the present disclosure have the following beneficial effects. The atomic beam optical clock with pulse modulated broad-spectrum clock laser detection includes the power control system, the broad-spectrum narrow-linewidth clock laser system, the atomic beam in the atomic beam vacuum tube (that is, the physical part of the atomic beam optical clock), the blue light detection laser system and the photoelectric detection module, where the power control system is configured to generate the pulse modulation signal and transmit the pulse modulation signal to the broad-spectrum narrow-linewidth clock laser system; the laser head of the broad-spectrum narrow-linewidth clock laser system is configured to generate the comb-toothed clock laser signal under the action of the pulse modulation signal, where the spectral interval between any two adjacent comb teeth of the comb-toothed clock laser signal is 10 kHz to 10 MHz, the overall spectral width of the comb-toothed clock laser signal is 10 MHz to 5 GHz, and the linewidth of the single comb tooth is smaller than the natural linewidth of the clock transition energy level; the atomic beam in the atomic beam vacuum tube is configured to provide atoms excited from the lower energy level of the clock transition to the upper energy level of the clock transition under the action of the comb-toothed clock laser signal; the blue light detection laser system is configured to emit the detection laser, such that the detection laser interacts with the atoms of the upper energy level of the clock transition or the atoms of the lower energy level of the clock transition to generate the fluorescent signal; and the photoelectric detection module is configured to collect the fluorescent signal and send the fluorescent signal to the power control system, such that the power control system locks the frequency of the comb-toothed clock laser signal of the broad-spectrum narrow-linewidth clock laser system. By generating the comb-toothed clock laser signal and interacting with the atomic beam, the clock laser spectrum covers the Doppler width of atoms of almost all different transverse velocity groups, such that almost all atoms of the lower energy level of the clock transition are excited to the upper energy level of the clock transition, and participate in a contribution to the clock transition spectroscopy, which achieves the clock transition spectroscopy with a very high signal-to-noise ratio, breaks through the international bottleneck problem of low utilization efficiency of atoms by the atomic beam optical clock in the past, exerts the special advantage of the high signal-to-noise ratio laser spectrum which is achieved by utilizing large parts of atoms in the atomic beam optical clock, and realizes a new atomic beam optical clock with pulse modulated broad-spectrum clock laser detection. In addition, the present disclosure has an advantage of adapting to a large variety of atoms including cooled and trapped atoms.

BRIEF DESCRIPTION OF THE DRAWINGS

The drawings are incorporated into the specification, form a part of the specification, show embodiments consistent with the present disclosure, and serve to explain the principles of the present disclosure together with the description.

Figure 1:
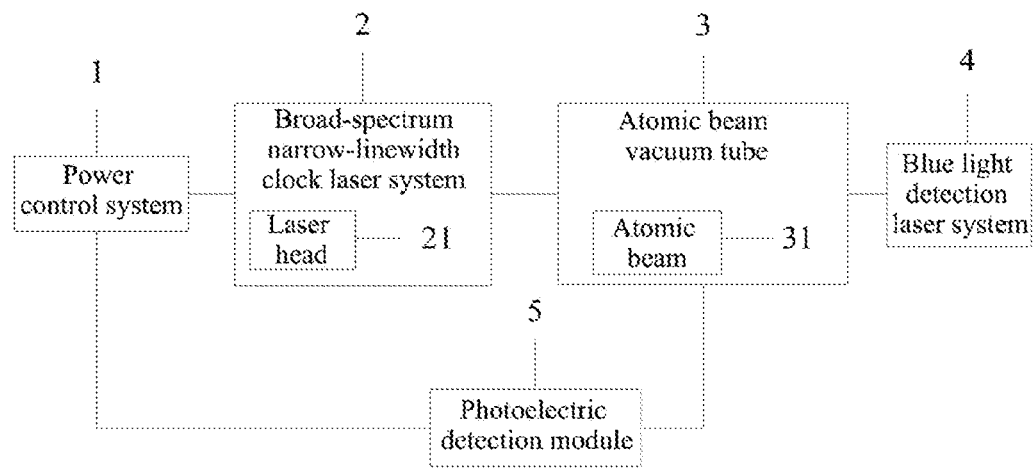
FIG. 1 is a schematic diagram of an atomic beam optical clock with pulse modulated broad-spectrum clock laser detection according to an embodiment of the present disclosure.

Reference numerals: 1, power control system; 2, broad-spectrum narrow-linewidth clock laser system; 21, laser head; 3, atomic beam vacuum tube; 31, atomic beam; 4, blue light detection laser system; 5, photoelectric detection module; 6, pulse modulation signal; 7, comb-toothed clock laser signal; 8, laser modulator.

The embodiments of the present disclosure have been shown by the above drawings, and will be described in more details later. The drawings and the description are not intended to limit the scope of the present disclosure in any way, but to illustrate the concepts of the present disclosure for those skilled in the art by referring to the specific embodiments.

DETAILED DESCRIPTION OF EMBODIMENTS

In the following description, specific details such as specific system structures, interfaces, and techniques are set forth for purposes of illustration but not limitation, so as to provide a thorough understanding of the present disclosure. However, it is apparent to those skilled in the art that the present disclosure may be implemented in other embodiments without these specific details. In other instances, detailed descriptions of well-known systems, circuits, and methods are omitted so as not to obscure the description of the present disclosure.

Embodiments of the present disclosure provide an atomic beam optical clock with pulse modulated broad-spectrum clock laser detection and an implementation method thereof.

The atomic beam optical clock is a device that generates time and frequency, and is widely used in the fields such as time keeping and time service, satellite navigation system, time synchronization, geodesy, and precision spectroscopy.

According to an aspect of embodiments of the present disclosure, an embodiment of the present disclosure provides an atomic beam optical clock with pulse modulated broad-spectrum clock laser detection.

Please refer to FIG. 1. FIG. 1 is a schematic diagram of an atomic beam optical clock with pulse modulated broad-spectrum clock laser detection according to an embodiment of the present disclosure.

As shown in FIG. 1, the atomic beam optical clock with pulse modulated broad-spectrum clock laser detection includes:

a power control system 1, configured to generate a pulse modulation signal, and transmit the pulse modulation signal to a broad-spectrum narrow-linewidth clock laser system 2.

In some embodiments, the power control system 1 can be configured to generate the pulse modulation signal, and can also be configured to have functions of modulating and demodulating a fluorescent signal, and generating a servo control signal. That is, the power control system further includes a modulation and demodulation circuit and a servo feedback circuit, as described in detail in the following description.

In some embodiments, a pulse width of the pulse modulation signal has a range from 0.2 ns to 100 ns, and an interval between any two adjacent pulses has a range from 0.1 μs to 100 μs.

In other embodiments, the pulse width of the pulse modulation signal is 1 ns, and the interval between any two adjacent pulses is 1 us.

A laser head 21 of the broad-spectrum narrow-linewidth clock laser system 2 is configured to generate a comb-toothed clock laser signal under an action of the pulse modulation signal, where a spectral interval between any two adjacent comb teeth of the comb-toothed clock laser signal is 10 kHz to 10 MHz, an overall spectral width of the comb-toothed clock laser signal is 10 MHz to 5 GHz, and a linewidth of a single comb tooth is smaller than the natural linewidth of the clock transition energy level.

In some embodiments, the spectral interval between any two adjacent comb teeth of the comb-toothed clock laser signal is 1 MHz, and the overall spectral width of the comb-toothed clock laser signal is 1 GHz.

An atomic beam 31 in the atomic beam vacuum tube 3 is configured to provide atoms excited from a lower energy level of the clock transition to an upper energy level of the clock transition under an action of the comb-toothed clock laser signal.

The comb-toothed clock laser signal interacts with the atomic beam, which provides almost all atoms excited from the lower energy level of the clock transition to the upper energy level of the clock transition using a Rabi Excitation Method or a Ramsey Excitation Method.

The atoms include any one of calcium atoms, magnesium atoms, strontium atoms, ytterbium atoms, mercury atoms, cadmium atoms, rubidium atoms, and cesium atoms.

A blue light detection laser system 4 is configured to emit a detection laser, such that the detection laser interacts with the atoms of the upper energy level of the clock transition or the atoms of the lower energy level of the clock transition to generate a fluorescent signal.

In some embodiments, the wavelength of the detection laser which is emitted by the blue light detection laser system and interacts with the atoms of the upper energy level of the clock transition is 431 nm; and the wavelength of the detection laser which is emitted by the blue light detection laser and interacts with the atoms of the lower energy level of the clock transition is 423 nm.

A photoelectric detection module 5 is configured to collect the fluorescent signal, and send the fluorescent signal to the power control system 1, such that the power control system 1 locks a frequency of the comb-toothed clock laser signal of the broad-spectrum narrow-linewidth clock laser system 2.

The photoelectric detection module 5 may specifically be a photomultiplier tube or a photodetector.

In the embodiments of the present disclosure, a new atomic beam optical clock with pulse modulated broad-spectrum clock laser detection is provided. The atomic beam optical clock with pulse modulated broad-spectrum clock laser detection includes the power control system 1, the broad-spectrum narrow-linewidth clock laser system 2, the atomic beam 31 in the atomic beam vacuum tube 3 (that is, the physical part of the atomic beam optical clock), the blue light detection laser system 4 and the photoelectric detection module 5, where the power control system 1 is configured to generate the pulse modulation signal and transmit the pulse modulation signal to the broad-spectrum narrow-linewidth clock laser system 2; the laser head 21 of the broad-spectrum narrow-linewidth clock laser system 2 is configured to generate the comb-toothed clock laser signal under the action of the pulse modulation signal, where the spectral interval between any two adjacent comb teeth of the comb-toothed clock laser signal is 10 kHz to 10 MHz, the overall spectral width of the comb-toothed clock laser signal is 10 MHz to 5 GHz, and the linewidth of the single comb tooth is smaller than the natural linewidth of the clock transition energy level; the atomic beam 31 in the atomic beam vacuum tube 3 is configured to provide the atoms excited from the lower energy level of the clock transition to the upper energy level of the clock transition under the action of the comb-toothed clock laser signal; the blue light detection laser system 4 is configured to emit the detection laser, such that the detection laser interacts with the atoms of the upper energy level of the clock transition or the atoms of the lower energy level of the clock transition to generate the fluorescent signal; and the photoelectric detection module 5 is configured to collect the fluorescent signal and send the fluorescent signal to the power control system, such that the power control system 1 locks the frequency of the comb-toothed clock laser signal of the broad-spectrum narrow-linewidth clock laser system 2. By generating the comb-toothed clock laser signal and interacting with the atomic beam, almost all atoms of the lower energy level of the clock transition are excited to the upper energy level of the clock transition, and then through the interaction with the detection laser emitted by the blue light detection laser system, the clock laser spectrum covers the Doppler width of atoms of almost all different transverse velocity groups, thus almost all atoms of the lower energy level of the clock transition are excited to the upper energy level of the clock transition and participate in a contribution to the clock transition spectroscopy, which achieves the clock transition spectroscopy with a very high signal-to-noise ratio, breaks through the international bottleneck problem of low utilization efficiency of atoms by the atom optical atomic clock in the past, exerts the special advantage of the high signal-to-noise ratio laser spectrum which is achieved by utilizing large parts of atoms by the atomic beam optical clock, and realizes a new atomic beam optical clock with pulse modulated broad-spectrum clock laser detection.

The modulation modes of the broad-spectrum narrow-linewidth clock laser system 2 include an internal modulation mode and an external modulation mode. The internal modulation will now be described in detail in conjunction with FIG. 2.

Figure 2:
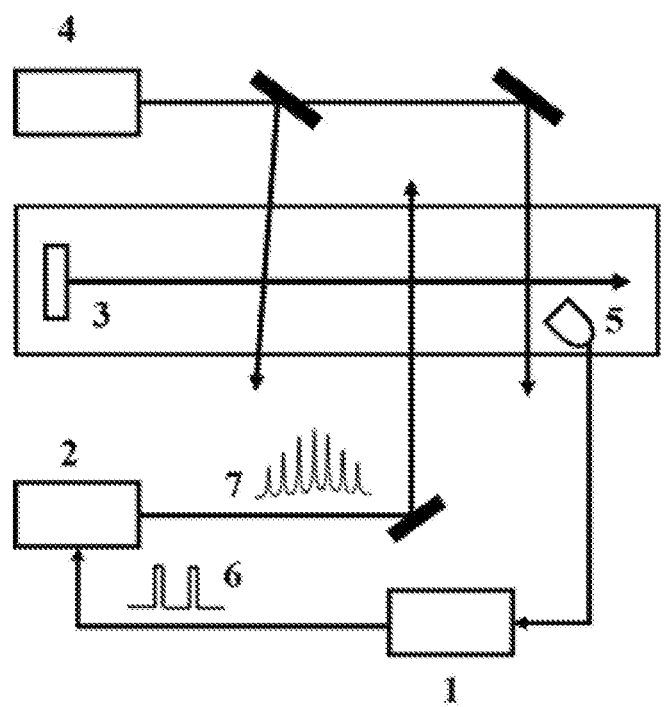
FIG. 2 is a schematic diagram of the principle of internal modulation according to an embodiment of the present disclosure.

As can be seen from FIG. 2, in the embodiments of the present disclosure, the pulse modulation signal 6 generated by the power control system 1 is applied to the laser head 21 of the broad-spectrum narrow-linewidth clock laser system 2 (which is specifically a laser head of a clock laser in the broad-spectrum narrow-linewidth clock laser system). The pulse modulation signal 6 has a pulse width of about 1 ns, and an interval between any two adjacent pulses is about 1 μs, and both the pulse width of the pulse modulation signal 6 and the interval between any two adjacent pulses are adjustable. After modulation, the outputted clock laser is represented in the frequency domain as a comb-toothed clock laser signal 7 which is of a "comb-tooth" shape. Each "comb-tooth" has a narrow-linewidth, and the interval between adjacent "comb-teeth" is about 1 MHz, that is, the spectral interval between any two adjacent comb teeth of the comb-toothed clock laser signal is about 1 MHz. The spectral width of the entire "comb-teeth" reaches about 1 GHz, that is, the spectral width of the comb-toothed clock laser signal is 1 GHz, covering atoms of almost all different transverse velocity groups. The pulse width of the pulse modulation signal 6 has a range from 0.2 ns to 100 ns, and the interval between any two adjacent pulses has a range from 0.1 μs to 100 μs. In other word, the comb-toothed clock laser signal 7 having the spectral width of about 1 GHz and the spectral interval of about 1 MHz has an overall spectral width that can be continuously adjusted from 10 MHz to 5 GHz, covering 1 GHz, and has a pulse repetition frequency corresponding to the pulse interval time that can be continuously adjusted from 10 kHz to 10 MHz, covering 1 MHz.

The comb-toothed clock laser signal 7 interacts with the atomic beam generated by the atomic beam vacuum tube 3, where the mode of action may be a Rabi Excitation Method or a Ramsey Excitation Method, to excite almost all atoms from a ground state to the upper energy level of the clock transition. Then the blue light detection laser system 4 is utilized to detect the population variations of the lower energy level or the upper energy level of the clock transition, where the blue light detection laser system 4 may be a 423 nm laser or a 431 nm laser.

Specifically, the blue light detection laser system 4 emits a frequency stabilized 423 nm laser or a 431 nm laser, where the 423 nm laser interacts with the atoms of the lower energy level of the clock transition, and the 431 nm laser interacts with the atoms of the upper energy level of the clock transition, to generate a fluorescent signal.

The fluorescent signal, i.e., the clock transition fluorescent spectroscopy signal, which is spontaneously radiated through the interaction between the blue light detection laser system 4 and the atoms, is collected by the photoelectric detection module 5 (a photoelectric tube or a photomultiplier). The fluorescent signal undergoes filtering, modulation and demodulation by the power control system 1 as well as the servo feedback circuit to precisely control the frequency of the comb-toothed clock laser signal of the broad-spectrum narrow-linewidth clock laser system 2, thereby realizing a high-stability atomic beam optical clock with pulse modulated broad-spectrum clock laser detection.

Figure 3:
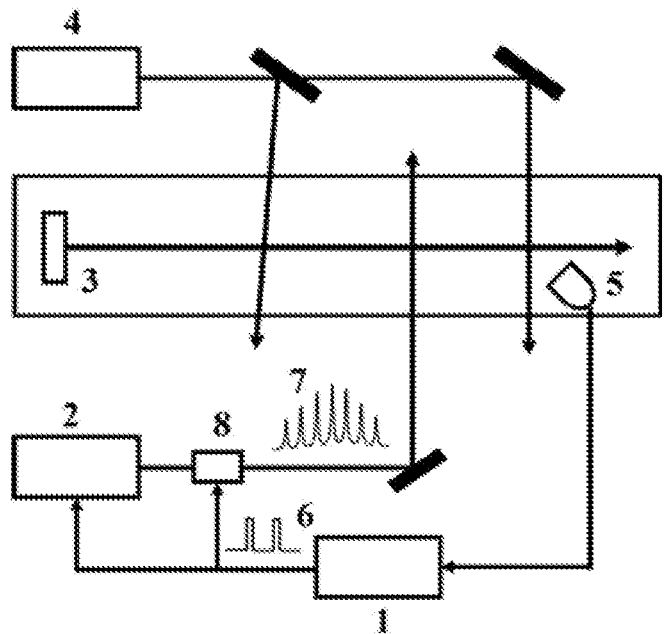
FIG. 3 is a schematic diagram of the principle of external modulation according to an embodiment of the present disclosure.

FIG. 3 shows the external modulation mode. As can be seen from FIG. 3, the pulse modulation signal 6 generated by the power control system 1 is applied to an external laser modulator 8, such as an electro-optic modulator, etc. The other processes are similar to the internal modulation mode shown in FIG. 2 and will not be described here again.

In the atomic beam optical clock of the embodiments of the present disclosure, the feature of the comb-toothed clock laser signal 7 for detecting the clock transition energy level is modulated by the pulse modulation signal 6, and is represented in the frequency domain as a broad-spectrum narrow-linewidth clock laser. In this case, the present disclosure is substantially different from the existing optical atomic clock which uses a single-line narrow-linewidth clock laser to detect the clock transition energy level. In the internationally existing solution, the utilization efficiency of atoms is as low as 0.1%, but the utilization efficiency of atoms in the present disclosure can be as high as 90% or more. In addition, the present disclosure is not limited to realizing a high-stability calcium atomic beam optical clock with pulse modulated broad-spectrum clock laser detection, and can also be applicable to an optical atomic clock with different quantum ensembles, such as magnesium, strontium, ytterbium, mercury, cadmium, cesium, rubidium, etc., where a detection laser of a corresponding wavelength is used according to its corresponding energy level, while maintaining the methods of comb-toothed pulse broad-spectrum detection unchanged. And it is even applicable to other vapor cell-based optical atomic clocks using alkali metals or alkaline earth metals.

According to another aspect of the embodiments of the present disclosure, an embodiment of the present disclosure provides a method for implementing an atomic beam optical clock with pulse modulated broad-spectrum clock laser detection.

Figure 4:
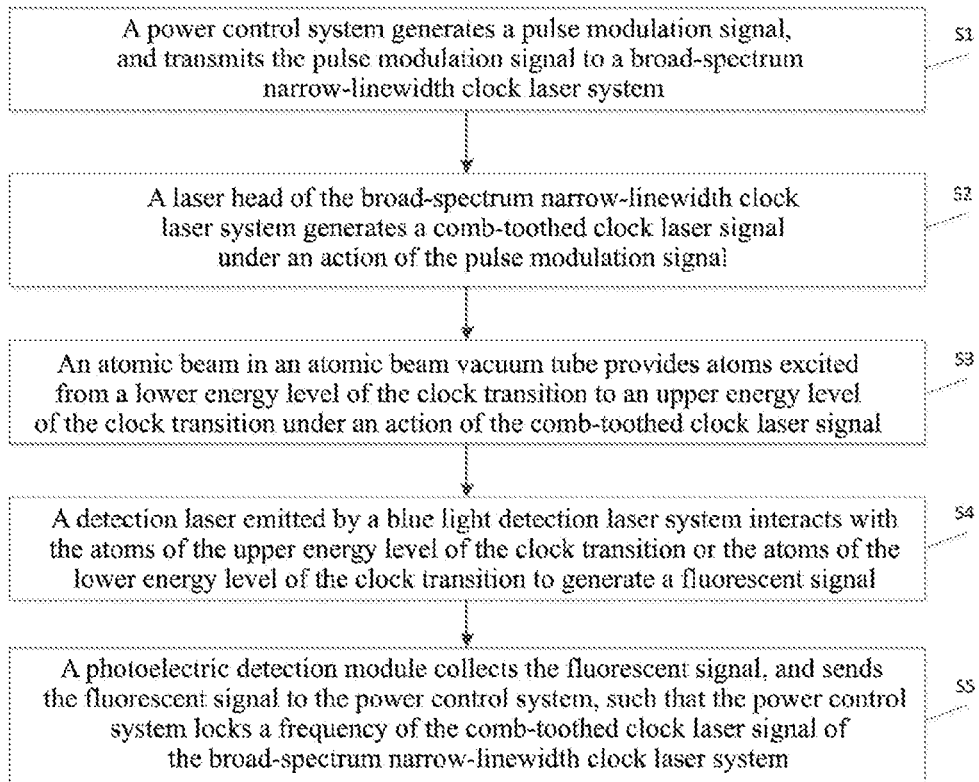
FIG. 4 is a schematic flow chart of a method for implementing an atomic beam optical clock with pulse modulated broad-spectrum clock laser detection according to an embodiment of the present disclosure.

Please refer to FIG. 4, FIG. 4 is a schematic flow chart of a method for implementing an atomic beam optical clock with pulse modulated broad-spectrum clock laser detection according to an embodiment of the present disclosure.

As shown in FIG. 4, the method includes:

S1: a power control system generates a pulse modulation signal, and transmits the pulse modulation signal to a broad-spectrum narrow-linewidth clock laser system.

S2: a laser head of the broad-spectrum narrow-linewidth clock laser system generates a comb-toothed clock laser signal under an action of the pulse modulation signal, where a spectral interval between any two adjacent comb teeth of the comb-toothed clock laser signal is 10 kHz to 10 MHz, an overall spectral width of the comb-toothed clock laser signal is 10 MHz to 5 GHz, and a linewidth of a single comb tooth is smaller than the natural linewidth of the clock transition energy level.

S3: an atomic beam in the atomic beam vacuum tube provides atoms excited from a lower energy level of the clock transition to an upper energy level of the clock transition under an action of the comb-toothed clock laser signal.

S4: a detection laser emitted by a blue light detection laser system interacts with the atoms of the upper energy level of the clock transition or the atoms of the lower energy level of the clock transition to generate a fluorescent signal.

S5: a photoelectric detection module collects the fluorescent signal, and sends the fluorescent signal to the power control system, such that the power control system locks the frequency of the comb-toothed clock laser signal of the broad-spectrum narrow-linewidth clock laser system.

In some embodiments, the atoms include any one of calcium atoms, magnesium atoms, strontium atoms, ytterbium atoms, mercury atoms, cadmium atoms, rubidium atoms, and cesium atoms.

In some embodiments, the methods provided by embodiments of the present disclosure are also applicable to cold atoms, such as cooled and trapped atoms.

In some embodiments, a pulse width of the pulse modulation signal has a range from 0.2 ns to 100 ns, and an interval between any two adjacent pulses has a range from 0.1 μs to 100 μs.

In some embodiments, the spectral interval between any two adjacent comb teeth of the comb-toothed clock laser signal is 1 MHz, and the overall spectral width of the comb-toothed clock laser signal is 1 GHz.

In some embodiments, a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

The solutions of the embodiments of the present disclosure will now be described in detail by taking calcium atoms as an example, specifically:

The power control system generates a pulse modulation signal with adjustable parameters where a pulse width thereof is about 1 ns, and an interval between any two adjacent pulses is about 1 μs. For the calcium atoms, the wavelength of the clock laser corresponds to the $^1S_0$-$^3P_1$ transition is 657 nm, specifically, the narrow-linewidth clock laser of 657 nm is modulated using a narrow pulse signal, where the modulation mode can be either internal modulation or external modulation, such that the clock laser spectrum is spectrally broadened to about 1 GHz, and is represented in the frequency domain as a series of broad-spectrum "frequency comb-teeth" with a frequency interval of about 1 MHz, where each frequency comb-tooth is still a narrow-linewidth laser. The modulated comb-toothed clock laser signal interacts with the calcium atoms. By using a Rabi Excitation Method or a Ramsey Excitation Method, the comb-toothed clock laser signal interacts with the ground state calcium atoms to excite the ground state calcium atoms of almost all transverse velocity groups to the upper energy level of the clock transition, and then the lower energy level or the upper energy level of the calcium atomic clock transition is detected by the frequency-locked blue light detection laser system, resulting in a narrow-linewidth clock transition fluorescent spectroscopy (that is, the fluorescent signal) with a very high signal-to-noise ratio. That is, the embodiments of the present disclosure utilize the ground state atoms of almost all different transverse velocity groups to contribute to the clock transition spectroscopy, which greatly improves the signal-to-noise ratio of the clock transition spectroscopy, thereby realizing a new atomic beam optical clock with miniaturized calcium optical clock with pulse modulated broad-spectrum laser detection, and greatly improving the frequency stability.

When the above frequency-locked blue light detection laser system detects the lower energy level of the calcium atomic clock transition, the wavelength of the detection laser of the blue light detection laser system is 423 nm corresponding to the calcium atom $^1S_0$-$^3P_1$ transition; and when the above frequency-locked blue light detection laser system detects the upper energy level of the calcium atom clock transition, the wavelength of the detection laser corresponding to the blue light detection laser system is 431 nm of the calcium atom $^3P_1$-$^3P_0$ transition.

The power control system also has modules such as calcium atoms oven temperature controller, radio frequency signal generator, modulation and demodulation circuit, and servo feedback circuit, in addition to generating the pulse modulation signal.

The blue light detection laser system may be a detection laser corresponding to 423 nm of the calcium atom $^1S_0$-$^3P_1$ transition, or a detection laser corresponding to 431 nm of the calcium atom $^3P_1$-$^3P_0$ transition. The Rabi Excitation Method is a two-beam "cat's eye" saturation spectrum method of the thermal atom beam, and the Ramsey Detection Method is a four-travelling-wave detection mode or a three-stationary-wave mode of the thermal atom beam.

The modulation and demodulation signal for the fluorescent signal is generated by the power control system. Specifically, the power control system modulates and demodulates the fluorescence signal to obtain a dispersive error signal, which is fed back by the servo feedback circuit to the frequency modulation port of the broad-spectrum narrow-linewidth clock laser system, to precisely lock the comb-toothed clock laser signal of the broad-spectrum narrow-linewidth clock laser system.

The reader should understand that in the description of the present specification, the description with reference to the terms "an embodiment", "some embodiments", "example", "specific example", or "some examples" and the like means that the specific features, structures, or characteristics described in connection with the embodiments or examples are included in at least one embodiment or example of the present disclosure. In the present specification, the schematic representation of the above terms is not necessarily directed to the same embodiment or example. Furthermore, the described particular features, structures, or characteristics may be combined in a suitable manner in any one or more embodiments or examples. In addition, in the absence of contradiction, those skilled in the art can combine and integrate the different embodiments or examples described in the specification as well as the features of the different embodiments or examples.

Those skilled in the art can clearly understand that, for the convenience and brevity of the description, the corresponding process in the foregoing method embodiments can be referred to for the specific working process of the apparatuses and the units described above, and details are not described here again.

In the several embodiments provided by the present application, it should be understood that the disclosed apparatuses and methods may be implemented in other manners. For example, the apparatus embodiments described above are merely illustrative. For example, the division of units is only a logical function division. In actual implementations, there may be other division manners. For example, multiple units or components may be combined or integrated into another system, or some features may be omitted or not implemented.

The units described as separate components may or may not be physically separate, and the components displayed as units may or may not be physical units, that is, they may be located in one place, or may be distributed to multiple network units. Some or all of the units may be selected according to actual needs to achieve the objectives of the embodiments of the present disclosure.

In addition, each functional unit in various embodiments of the present disclosure may be integrated into one processing unit, or each unit may exist physically separately, or two or more units may be integrated into one unit. The above integrated unit can be implemented in the form of hardware or in the form of a software functional unit.

An integrated unit, if implemented in the form of a software functional unit and sold or used as a standalone product, can be stored in a computer readable storage medium. Based on such understanding, the technical solutions of the present disclosure essentially, or the portion of the technical solutions of the present disclosure that contributes to the prior art, or all or part of the technical solutions of the present disclosure can be embodied in the form of a software product, and the computer software product is stored in a storage medium and includes several instructions for causing a computer device (which may be a personal computer, a server, or a network device, and the like) to perform all or part of the steps of the various embodiments of the present disclosure. The foregoing storage medium includes various mediums capable of storing program codes, such as a U disk, a mobile hard disk, a read-only memory (ROM), a random access memory (RAM), a magnetic disk, or an optical disk, or the like.

It should also be understood that, in the embodiments of the present disclosure, the size of the sequence numbers of the above processes is not intended to be an order of executions, and the order of executions of the processes should be determined by their functions and internal logic, but should not be construed as limiting the implementation of the embodiments of the present disclosure.

The above are only the specific embodiments of the present disclosure, but the scope of the present disclosure is not limited thereto. Those skilled in the art can easily conceive various equivalent modifications or substitutions within the scope of the present disclosure, and such modifications or substitutions are intended to be included within the scope of the present disclosure. Therefore, the protection scope of the present disclosure should be determined by the protection scope of the claims.

What is claimed is:

1. An atomic beam optical clock with pulse modulated broad-spectrum clock laser detection, wherein the atomic beam optical clock with pulse modulated broad-spectrum clock laser detection comprises:
    a power control system, configured to generate a pulse modulation signal, and transmit the pulse modulation signal to a broad-spectrum narrow-linewidth clock laser system;
    a broad-spectrum narrow-linewidth clock laser system, wherein a laser head of the broad-spectrum narrow-linewidth clock laser system is configured to generate a comb-toothed clock laser signal under an action of the pulse modulation signal, wherein a spectral interval between any two adjacent comb teeth of the comb-toothed clock laser signal is 10 kHz to 10 MHz, an overall spectral width of the comb-toothed clock laser signal is 10 MHz to 5 GHz, and laser corresponding to a single comb tooth is narrow-linewidth laser and the linewidth of the single comb tooth is smaller than a natural linewidth of a clock transition energy level;
    an atomic beam in an atomic beam vacuum tube, configured to provide atoms excited from a lower energy level of the clock transition to an upper energy level of the clock transition under a two-beam Rabi action or a four-travelling-wave Ramsey action or a three-stationary-wave Ramsey action of the comb-toothed clock laser signal;
    a blue light detection laser system, configured to emit a detection laser, such that the detection laser interacts with the atoms of the upper energy level of the clock transition or the atoms of the lower energy level of the clock transition to generate a fluorescent signal; and
    a photoelectric detection module, configured to collect the fluorescent signal, and send the fluorescent signal to the power control system, such that the power control system locks a frequency of the comb-toothed clock laser signal of the broad-spectrum narrow-linewidth clock laser system.

2. The atomic beam optical clock with pulse modulated broad-spectrum clock laser detection according to claim 1, wherein the atoms comprise any one of calcium atoms, magnesium atoms, strontium atoms, ytterbium atoms, mercury atoms, cadmium atoms, rubidium atoms, and cesium atoms.

3. The atomic beam optical clock with pulse modulated broad-spectrum clock laser detection according to claim 1, wherein a pulse width of the pulse modulation signal has a range from 0.2 ns to 100 ns, and an interval between any two adjacent pulses has a range from 0.1 µs to 100 µs.

4. The atomic beam optical clock with pulse modulated broad-spectrum clock laser detection according to claim 1, wherein the spectral interval between any two adjacent comb teeth of the comb-toothed clock laser signal is 1 MHz, and the overall spectral width of a comb-toothed clock laser signal is 1 GHz.

5. The atomic beam optical clock with pulse modulated broad-spectrum clock laser detection according to claim 2, wherein the spectral interval between any two adjacent comb teeth of the comb-toothed clock laser signal is 1 MHz, and the overall spectral width of a comb-toothed clock laser signal is 1 GHz.

6. The atomic beam optical clock with pulse modulated broad-spectrum clock laser detection according to claim 3, wherein the spectral interval between any two adjacent comb teeth of the comb-toothed clock laser signal is 1 MHz, and the overall spectral width of a comb-toothed clock laser signal is 1 GHz.

7. The atomic beam optical clock with pulse modulated broad-spectrum clock laser detection according to claim 1, wherein a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

8. The atomic beam optical clock with pulse modulated broad-spectrum clock laser detection according to claim 2, wherein a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

9. The atomic beam optical clock with pulse modulated broad-spectrum clock laser detection according to claim 3, wherein a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

10. A method for implementing an atomic beam optical clock with pulse modulated broad-spectrum clock laser detection, wherein the method comprises:

generating, by a power control system, a pulse modulation signal, and transmitting, by the power control system, the pulse modulation signal to a broad-spectrum narrow-linewidth clock laser system;

generating, by a laser head of the broad-spectrum narrow-linewidth clock laser system, a comb-toothed clock laser signal under an action of the pulse modulation signal, wherein a spectral interval between any two adjacent comb teeth of the comb-toothed clock laser signal is 10 kHz to 10 MHz, an overall spectral width of the comb-toothed clock laser signal is 10 MHz to 5 GHz, and laser corresponding to a single comb tooth is narrow-linewidth laser and the linewidth of the single comb tooth is smaller than a natural linewidth of a clock transition energy level;

providing, by an atomic beam in an atomic beam vacuum tube, atoms excited from a lower energy level of the clock transition to an upper energy level of the clock transition under a two-beam Rabi action or a four-travelling-wave Ramsey action or a three-stationary-wave Ramsey action of the comb-toothed clock laser signal;

generating a fluorescent signal through an interaction between a detection laser emitted by a blue light detection laser system and the atoms of the upper energy level of the clock transition or the atoms of the lower energy level of the clock transition; and collecting, by a photoelectric detection module, the fluorescent signal, and sending, by the photoelectric detection module, the fluorescent signal to the power control system, such that the power control system locks a frequency of the comb-toothed clock laser signal of the broad-spectrum narrow-linewidth clock laser system.

11. The method according to claim 10, wherein the atoms comprise any one of calcium atoms, magnesium atoms, strontium atoms, ytterbium atoms, mercury atoms, cadmium atoms, rubidium atoms, and cesium atoms.

12. The method according to claim 10, wherein a pulse width of the pulse modulation signal has a range from 0.2 ns to 100 ns, and an interval between any two adjacent pulses has a range from 0.1 μs to 100 μs.

13. The method according to claim 10, wherein the spectral interval between any two adjacent comb teeth of the comb-toothed clock laser signal is 1 MHz, and the overall spectral width of the comb-toothed clock laser signal is 1 GHz.

14. The method according to claim 11, wherein the spectral interval between any two adjacent comb teeth of the comb-toothed clock laser signal is 1 MHz, and the overall spectral width of the comb-toothed clock laser signal is 1 GHz.

15. The method according to claim 12, wherein the spectral interval between any two adjacent comb teeth of the comb-toothed clock laser signal is 1 MHz, and the overall spectral width of the comb-toothed clock laser signal is 1 GHz.

16. The method according to claim 10, wherein a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

17. The method according to claim 11, wherein a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

18. The method according to claim 12, wherein a wavelength of the detection laser which is emitted by the blue light detection laser system and interacts with the atoms of the upper energy level of the clock transition is 431 nm; and a wavelength of the detection laser which is emitted by the blue light detection laser system and interacts with the atoms of the lower energy level of the clock transition is 423 nm.

* * * * *